(12) United States Patent
Nam et al.

(10) Patent No.: US 12,436,457 B2
(45) Date of Patent: Oct. 7, 2025

(54) DEVELOPING APPARATUS AND SUBSTRATE PROCESSING APPARATUS

(71) Applicant: STATS ChipPAC Pte. Ltd., Singapore (SG)

(72) Inventors: Giwoong Nam, Incheon (KR); Jin Kwak, Chungcheongnam-do (KR); Jaeseung Lee, Seoul (KR); Taekyu Choi, Incheon (KR); Inho Son, Incheon (KR); Sanghyun Park, Gyeongsangnam-do (KR); Yeongwon Kang, Gyeonggi-do (KR)

( * ) Notice: Subject to any disclaimer, the term of this patent is extended or adjusted under 35 U.S.C. 154(b) by 195 days.

(21) Appl. No.: 18/333,570

(22) Filed: Jun. 13, 2023

(65) Prior Publication Data

US 2023/0408915 A1    Dec. 21, 2023

(30) Foreign Application Priority Data

Jun. 16, 2022    (CN) .......................... 202210684598.5

(51) Int. Cl.
   *G03F 7/00*        (2006.01)
(52) U.S. Cl.
   CPC ................... *G03F 7/0025* (2013.01)
(58) Field of Classification Search
   CPC ........ G03F 7/0025; G03F 7/30; G03F 7/3021; H01L 21/6715
   See application file for complete search history.

(56) References Cited

U.S. PATENT DOCUMENTS

| 5,472,502 | A  | * | 12/1995 | Batchelder | .......... H01L 21/6715 118/63 |
|---|---|---|---|---|---|
| 6,599,366 | B1 | * | 7/2003 | Kitano | ................ H01L 21/6715 118/63 |
| 6,709,174 | B2 | * | 3/2004 | Yamamoto | ............ B05C 5/0254 427/420 |
| 7,338,223 | B2 | * | 3/2008 | Ito | ....................... H01L 21/6875 396/611 |
| 7,479,463 | B2 |   | 1/2009 | Kulp et al. | |
| 9,887,107 | B2 |   | 2/2018 | Stiyer et al. | |
| 2019/0030558 | A1 |   | 1/2019 | Kaneko et al. | |

FOREIGN PATENT DOCUMENTS

| CN | 1220245 C | 9/2005 |
|---|---|---|
| TW | 200810833 A | 3/2008 |

* cited by examiner

*Primary Examiner* — Hung V Nguyen
(74) *Attorney, Agent, or Firm* — Junhe Law Office, P.C.; Yi Zhang

(57) ABSTRACT

The present application relates to a developing apparatus. The developing apparatus comprises a housing; a wafer support disposed within the housing and for holding a wafer; a semipermeable diaphragm disposed within the housing and separating the housing into an upper housing defining an upper chamber and a lower housing defining a low chamber, wherein the semipermeable diaphragm is semipermeable to moisture such that moisture is allowed to move from the lower chamber to the upper chamber, but liquid drops are prohibited to move from the upper chamber to the lower chamber; and a nozzle assembly disposed above the wafer support and for spraying at least developer to the wafer support.

9 Claims, 3 Drawing Sheets

DEVELOPING APPARATUS AND SUBSTRATE PROCESSING APPARATUS

TECHNICAL FIELD

The present application generally relates to semiconductor manufacturing technology, and more particularly, to a developing apparatus for photolithography.

BACKGROUND OF THE INVENTION

Developing process is an essential step of photolithography which transfers patterns in photoresist to a wafer surface during substrate processing. Specifically, certain soluble areas of the photoresist can be dissolved by developer, leaving islands or window patterns of photoresist on the wafer surface under the photoresist.

There are two typical developing methods, i.e., continuous spray development and puddle development. The continuous spray development has a better development speed than the puddle development, because a fine mist of developer can be uniformly deposited on the wafer as the wafer is rotated inside a developing apparatus. However, the continuous spray development may have a serious issue, i.e., the mist of developer or water sprayed from nozzles of the developing apparatus may immediately rebound from the wafer surface to a housing of the developing apparatus, resulting in chemical or water drops that may fall onto the wafer surface.

Therefore, a need exists for an improved developing apparatus for photolithography.

SUMMARY OF THE INVENTION

An objective of the present application provides a developing apparatus for photolithography, which can avoid undesired liquid drops from falling onto a wafer in the developing apparatus during a developing process.

According to an aspect of the present application, a developing apparatus is provided. The developing apparatus comprises a housing; a wafer support disposed within the housing and for holding a wafer; a semipermeable diaphragm disposed within the housing and separating the housing into an upper housing defining an upper chamber and a lower housing defining a low chamber, wherein the semipermeable diaphragm is semipermeable to moisture such that moisture is allowed to move from the lower chamber to the upper chamber, but liquid drops formed from the moisture are prohibited to move from the upper chamber to the lower chamber; and a nozzle assembly disposed above the wafer support and for spraying at least developer to the wafer support.

It is to be understood that both the foregoing general description and the following detailed description are exemplary and explanatory only and are not restrictive of the invention. Further, the accompanying drawings, which are incorporated in and constitute a part of this specification, illustrate embodiments of the invention and together with the description, serve to explain the principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

The same reference numbers will be used throughout the drawings to refer to the same or like parts.

DETAILED DESCRIPTION OF THE INVENTION

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1:
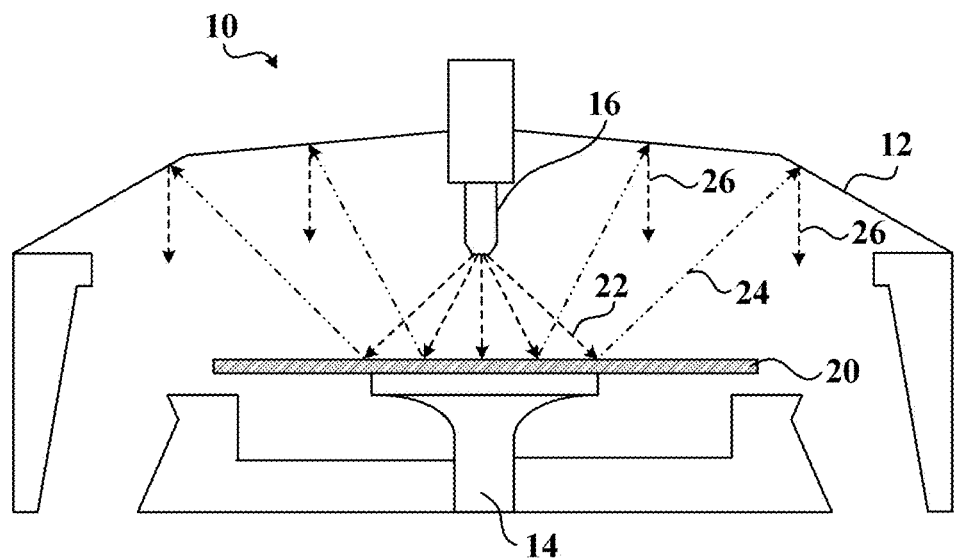
FIG. 1 illustrates a conventional developing apparatus.

FIG. 1 illustrates a conventional developing apparatus 10. The developing apparatus 10 can be used in photolithography to develop photoresist after exposure.

As shown in FIG. 1, the developing apparatus 10 includes a housing 12, a wafer support 14, and a nozzle assembly 16. The housing 12 defines a chamber for receiving the wafer support 14 and the nozzle assembly 16. When a wafer 20 is loaded on the wafer support 14 inside the housing 12, developer, i.e., a developing solution, or other liquid such as water may be sprayed onto the wafer 20 from the nozzle assembly 16, as indicated by a first path 22. Although most of the kinetic energy of the sprayed liquid may be absorbed by photoresist coated on the wafer 20, a portion of the liquid may be rebounded by the wafer 20 towards the housing 12 in form of moisture containing small liquid particles or vapor, as indicated by a second path 24. Following the second path 24, some of the rebounded moisture may arrive at an inner surface of the housing 12 and accumulate there. Later after the spraying process, the liquid particles and vapor accumulated on the inner surface of the housing 12 further coagulate and form liquid drops that may fall onto the wafer 20 due to gravity, as indicated by a third path 26. The water drops falling onto the wafer 20 are undesired because it may cause defects in the photoresist on the wafer 20, which may later result in defects in the patterns on the wafer.

Figure 2:
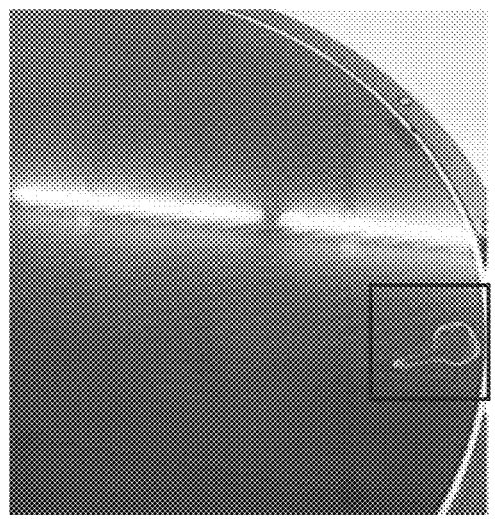
FIG. 2 is a photograph of liquid drops on a wafer after a developing process performed by the conventional developing apparatus.

FIG. 2 is a photograph of a wafer with contaminants formed by liquid drops after a developing process, and the process is performed by the conventional developing apparatus shown in FIG. 1. As can be seen, there is a water stain on the surface of the wafer. The semiconductor dice (although not singulated in FIG. 2) covered by the water stain may be contaminated and thus a yield of semiconductor dice from the wafer may be reduced.

Figure 3:
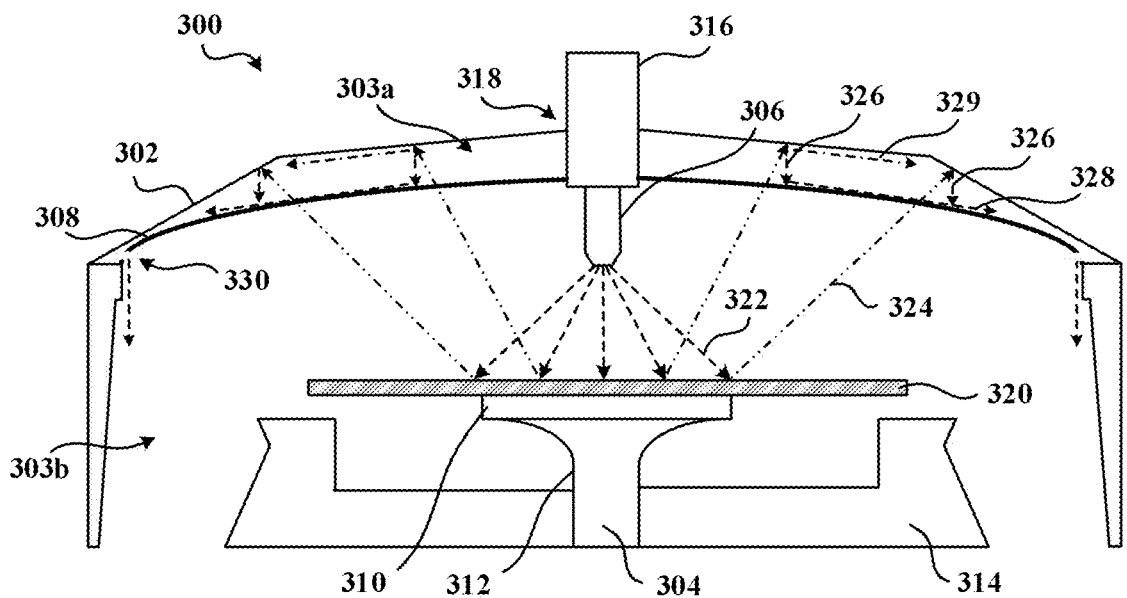
FIG. 3 illustrates a developing apparatus according to an embodiment of the present application.

The inventors of the present invention conceived a new design in the structure of the developing apparatus, which effectively resolved the above liquid drop issue for conventional developing apparatus. FIG. 3 illustrate a developing apparatus 300 according to an embodiment of the present application.

As shown in FIG. 3, the developing apparatus 300 includes a housing 302 which define a chamber. Various components can be disposed in the developing apparatus 300 to perform a developing process. In particular, a wafer support 304 is disposed within the housing 302, e.g., at its bottom, to hold a wafer 320 thereon. The wafer support 304 may include a rotatable platform 310, a drive shaft 312, and a base 314. The rotatable platform 310 is positioned at the center of the wafer support 304 and holds the wafer 320 with its top surface. An upper end of the drive shaft 312 is connected to the rotatable platform 310, and a lower end of the drive shaft 312 is connected to and supported by the base 314. When the drive shaft 312 rotates with respect to a vertical axis, the rotatable platform 310 and the wafer 320 held thereon can be rotated accordingly. In some embodiments, the draft shaft 312 may be driven by a stepper motor, and in some other embodiments, the draft shaft 312 may be driven by some other actuation mechanism. The base 314 is positioned under the rotatable platform 310 and the drive shaft 312. In some embodiments, the size of the base 314 is larger than the size of the rotatable platform 310 so that the base 314 can collect liquids that are scattered from the wafer 320 such as developer and rinse water.

The developing apparatus 300 further includes a nozzle assembly 306 which is disposed above the wafer support 304 inside the housing 302. The nozzle assembly 306 is used for spraying liquids that may be used in the developing process to the wafer support 304. For example, the nozzle assembly 306 may spray one or a combination of the following: rinse water such as de-ionized water, developer, or other desired solutions. In order to spray different kinds of liquids, two or more nozzles may be included in the nozzle assembly 306, and each nozzle may be fluidly coupled to a liquid source outside of the housing 302. In the embodiment, five nozzles may be arranged in a row, with three developer nozzles used for spraying developer and two rinse nozzles used for spraying rinse water. The position and/or orientation of the nozzles may differ from each other to cover an entire top surface of the wafer 320. Since the wafer 320 can be rotated by the rotatable platform 310 with respect to the nozzle assembly 306, the developer and rinse water can be uniformed sprayed on the wafer 320 to react with photoresist coated on the wafer 320. In some embodiments, the developer can be an alkaline developing solution such as TMAH solution. The rinse water can remove the residual developer and photoresist debris from the wafer 320. In the embodiment shown in FIG. 3, the nozzle assembly 306 may be suspended from a support arm 316, through an opening 318 at the top of the housing 302. In some embodiments, a distance between the nozzle assembly 306 and the wafer support 304 may be adjusted by adjusting a height of the support arm 316. For example, the support arms 316 and the nozzle assembly 306 may be moved higher to cover a bigger wafer, or may be moved lower to cover a smaller wafer.

The developing apparatus 300 may perform the developing process as follows: (a) a wafer can be disposed on the rotatable platform 304 and then be rotated by the rotatable platform 304; (b) the developer can be supplied onto the wafer from the developer nozzles and spreads over the top surface of the wafer due to a centrifugal force generated as the wafer is rotated, such that the photoresist coated on the wafer can be processed by the developer; (c) rinse water can be supplied from the rinse nozzles to the wafer to remove the residual developer and photoresist debris on the wafer; and optionally (d) the wafer can be dried for subsequent processing such as etching or selective deposition.

As aforementioned, during the above developing process, moisture may be rebounded from the wafer 320 towards an inner surface of the housing 302, especially towards an upper portion of the housing 302. In order to collect and capture these liquid particles or vapors, the developing apparatus 300 further includes a semipermeable diaphragm 308 disposed within the housing 302. As shown in FIG. 3, the semipermeable diaphragm 308 separates the housing 302 into an upper housing defining an upper chamber 303a and a lower housing defining a lower chamber 303b. The nozzle assembly 306, the wafer 320 and the wafer support 304 are mainly located in the lower chamber 303b, and thus the lower chamber 303b takes up the main space inside the housing 302.

The semipermeable diaphragm 308 is semipermeable to moisture such that smaller liquid particles or vapor rebounded from the wafer 320 is allowed to move from the lower chamber 303b to the upper chamber 303a, but liquid drops of a bigger size, which are condensated from moisture and fall due to gravity, are prohibited to move from the upper chamber 303a to the lower chamber 303b. In some embodiments, the semipermeable diaphragm 308 includes polypropylene, e.g., made of a polypropylene film. Polypropylene is derived from a thermoplastic polymer, which can be made from propene monomer. The main benefit of polypropylene as a fabric is its moisture transfer ability, i.e., it cannot absorb any moisture, and instead, moisture can pass through polypropylene fabric entirely. With the moisture transfer ability, moisture can freely pass through the semipermeable diaphragm 308, and afterwards liquid drops which coagulate from moisture accumulated on the inner surface of the housing 302 can be avoided from falling onto the wafer 320 in the lower chamber 303b. In some other embodiments, the semipermeable diaphragm 308 may include polyethylene, polyurethane, polypropylene or any combination thereof.

In particular, developer or rinse water may be sprayed from the nozzle assembly 306 to the wafer 320, as indicated by a first path 322. Afterwards, the moisture or small liquid particles may be rebounded from the wafer 320 to the semipermeable diaphragm 308, as indicated by a second path 324. The semipermeable diaphragm 308 allows the further movement of the moisture onto the inner surface of the upper housing. If significant moisture accumulates on the inner surface of the upper housing, water drops may be formed and fall in a third path 326 till the semipermeable diaphragm 308, and then flow over the semipermeable diaphragm 308 in a fourth path 328. In this way, the water drops cannot fall down onto the wafer 320 which is directly under the central portion of the semipermeable diaphragm 308.

The semipermeable diaphragm 308 may be formed in any other desired shape, depending on the shape of the upper housing 302. For example, the semipermeable diaphragm 308 can be shaped as a dome or another appropriate structure. The dome-shaped diaphragm 308 may avoid water drops from accumulating at its central portion and facilitate the water flow 328 towards a periphery of the semipermeable diaphragm 308. In some embodiments, guide channels or similar structures may be formed on the top surface of the semipermeable diaphragm 308 to guide water towards the periphery of the semipermeable diaphragm 308. In some embodiments, the periphery of the semipermeable diaphragm 308 can be attached to the housing 302 and at least one outlet 330 can be positioned at the periphery of the semipermeable diaphragm 308, such that water can be drained out of the upper chamber 303a through the at least one outlet and may not accumulate anywhere in the upper chamber 303a, as shown by a fifth path 331. In some embodiments, two outlets opposite to each other can be positioned at the periphery of the semipermeable diaphragm 308, or even more outlets can be positioned at the periphery. It is not desired to position the outlet(s) 330 directly above the wafer 320. In some embodiment, guide channels or similar structures may be formed on the top surface of the semipermeable diaphragm 308 and fluidly coupled to the openings to guide water towards the openings at the periphery of the semipermeable diaphragm 308. As such, the drained water drops may fall to a region outside of the wafer 320 and thus no contaminants may be formed on the wafer 320.

Figure 4:
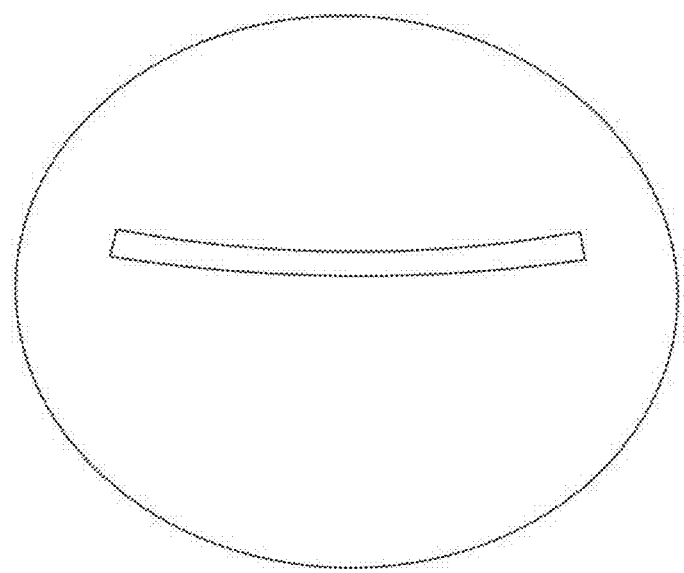
FIG. 4 illustrates a photograph of a semipermeable diaphragm used in the developing apparatus shown in FIG. 3.

FIG. 4 illustrates a photograph of a semipermeable diaphragm used in the developing apparatus shown in FIG. 3. As shown in FIG. 4, the semipermeable diaphragm is shaped as a dome with a circular periphery that fits to the inner sidewall of the housing. Also, an opening is formed at the central portion of the semipermeable diaphragm, which allows the nozzle assembly to pass through it. In this way, the support arm for the nozzle assembly may pass through the opening from the housing to position a row of nozzles below the semipermeable diaphragm.

In some embodiments, a hydrophilic coating (not shown) can be coated on the inner surface of the upper housing 302. The hydrophilic coating has an affinity for water and contact angle of water drops is less than 30 degrees. In contrast to hydrophobic coating, water adhered onto the hydrophilic coating cannot coagulate into water drops immediately but form a water film on the inner surface of the hydrophilic coating. When the water film accumulates to certain extent, water can flow down along the inner surface of the hydrophilic coating, following a sixth path 329, towards the periphery of the upper housing. In this way, water can be guided to the outlets 330 at the periphery of the semipermeable diaphragm 308. In some embodiments, the hydrophilic coating can include nano silica or any other similar materials.

In some embodiments, an exhaust fan or other similar structures may be fluidly coupled to the upper chamber 303a of the developing apparatus 300, to create an air pressure lower than that of the lower chamber 303b. In this way, the difference in air pressure may further improve the collection of moisture from the lower chamber 303b to the upper chamber 303a.

It can be appreciated that the semipermeable diaphragm as described above can be used in other substrate processing apparatus similarly. The substrate processing apparatus can be a wafer or substrate cleaning apparatus that may spray liquids such as rinse water, acid solutions and/or alkaline solutions onto substrates (e.g., a wafer or a printed circuit board) loaded inside the processing apparatus.

Figure 5:
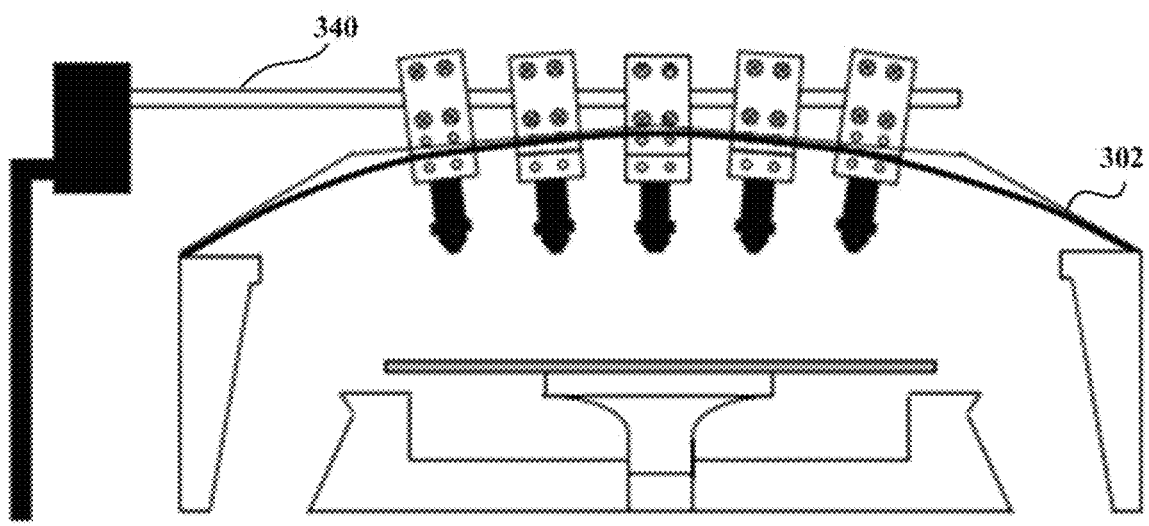
FIG. 5 illustrates another view of the developing apparatus shown in FIG. 3.

As aforementioned, the support arm may be used to support or suspend the nozzle assembly. In some embodiments, the developing apparatus 300 includes a plurality of support arms, each for mounting a nozzle of the nozzle assembly. FIG. 5 illustrates another view of the developing apparatus 300 shown in FIG. 3. As shown in FIG. 5, five support arms are mounted on a bracket 340 outside of the housing 302, and each of the support arms may be used to mount a nozzle of the nozzle assembly. The support arms may pass through an opening topmost of the housing 302 and the opening of the semipermeable diaphragm.

A test has been performed using a developing apparatus according to an embodiment of the present application, as compared with the conventional developing apparatus without a semipermeable diaphragm. In particular, 149 wafers have been developed using the conventional developing apparatus, and water contaminants or stains can be found on the wafer surfaces for 20 of 149 wafers. In contrast, 311 wafers have been developed using the developing apparatus of the embodiment of the present application and no water contaminants or stains can be found on the wafer surfaces for all the 311 wafer surfaces. The test result shows that the water drop issue can be resolved very well.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A developing apparatus, comprising:
   a housing;
   a wafer support disposed within the housing and for holding a wafer;
   a semipermeable diaphragm disposed within the housing and separating the housing into an upper housing defining an upper chamber and a lower housing defining a low chamber, wherein the semipermeable diaphragm is semipermeable to moisture such that moisture is allowed to move from the lower chamber to the upper chamber, but liquid drops formed from the moisture are prohibited to move from the upper chamber to the lower chamber; and a nozzle assembly disposed above the wafer support and for spraying at least developer to the wafer support;

wherein the upper housing comprises an opening, and the semipermeable diaphragm comprises an opening corresponding to the opening of the upper housing, wherein the developing apparatus further comprises:

a support arm that passes through the openings of the upper housing and the semipermeable diaphragm and for mounting the nozzle assembly.

2. The developing apparatus of claim 1, further comprising:

a hydrophilic coating disposed on an inner surface of the upper housing.

3. The developing apparatus of claim 1, wherein the semipermeable diaphragm includes polyethylene, polyurethane, polypropylene or any combination thereof.

4. The developing apparatus of claim 1, wherein the semipermeable diaphragm is shaped as a dome.

5. A developing apparatus comprising:

a housing;

a wafer support disposed within the housing and for holding a wafer;

a semipermeable diaphragm disposed within the housing and separating the housing into an upper housing defining an upper chamber and a lower housing defining a low chamber, wherein the semipermeable diaphragm is semipermeable to moisture such that moisture is allowed to move from the lower chamber to the upper chamber, but liquid drops formed from the moisture are prohibited to move from the upper chamber to the lower chamber; and a nozzle assembly disposed above the wafer support and for spraying at least developer to the wafer support;

wherein the semipermeable diaphragm comprises a periphery along which it is attached to the housing, and at least one outlet is positioned at the periphery such that water can be drained out of the upper chamber through the at least one outlet.

6. The developing apparatus of claim 5, wherein the at least one outlet is not directly above the wafer when it is held by the wafer support.

7. The developing apparatus of claim 5, further comprising:

a hydrophilic coating disposed on an inner surface of the upper housing.

8. The developing apparatus of claim 5, wherein the semipermeable diaphragm includes polyethylene, polyurethane, polypropylene or any combination thereof.

9. The developing apparatus of claim 5, wherein the semipermeable diaphragm is shaped as a dome.

* * * * *